(12) United States Patent
Yonezawa et al.

(10) Patent No.: US 8,415,964 B2
(45) Date of Patent: Apr. 9, 2013

(54) PROBE CARD HAVING A STRUCTURE FOR BEING PREVENTED FROM DEFORMING

(75) Inventors: Toshihiro Yonezawa, Nirasaki (JP); Shinichiro Takase, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 12/745,303

(22) PCT Filed: Nov. 5, 2008

(86) PCT No.: PCT/JP2008/070110
§ 371 (c)(1),
(2), (4) Date: Jun. 9, 2010

(87) PCT Pub. No.: WO2009/069439
PCT Pub. Date: Jun. 4, 2009

(65) Prior Publication Data
US 2010/0301887 A1 Dec. 2, 2010

(30) Foreign Application Priority Data

Nov. 30, 2007 (JP) .................................. 2007-310114

(51) Int. Cl.
*G01R 31/00* (2006.01)
(52) U.S. Cl.
USPC .................................. 324/756.03; 324/756.01
(58) Field of Classification Search .................... None
See application file for complete search history.

(56) References Cited

U.S. PATENT DOCUMENTS

| 7,075,319 B2 * | 7/2006 | Mori ........................ 324/750.25 |
| 2006/0061375 A1 * | 3/2006 | Mori ............................. 324/754 |
| 2006/0240581 A1 | 10/2006 | Suzuki et al. |

FOREIGN PATENT DOCUMENTS

| EP | 2128630 | 12/2009 |
| JP | 2006-010629 | 1/2006 |
| JP | 2006-300733 | 11/2006 |
| JP | 2007-057438 | 3/2007 |
| JP | 2007-178405 | 7/2007 |

OTHER PUBLICATIONS

International Search Report—PCT/JP2008/070110 dated Feb. 24, 2009.
Korean Office Action—Korean Application No. 10-2010-7010746 issued on Jul. 27, 2011, citing JP 2007-057438, JP 2006-300733, and JP 2007-178405.

* cited by examiner

*Primary Examiner* — Minh N Tang
(74) *Attorney, Agent, or Firm* — Cantor Colburn LLP

(57) ABSTRACT

A probe card according to the present invention includes a support plate for supporting probes that contact an object to be inspected, a circuit board, a holding member for holding a lower surface of an outer peripheral portion of the support plate, and an abutting member disposed between the lower surface of the outer peripheral portion of the support plate and the holding member and protruding upward to abut to the lower surface of the outer peripheral portion of the support plate. Accordingly, horizontal expansion of the support plate itself is allowed, and at the time of inspecting electrical characteristics of the object to be inspected, even though the temperature of the support plate is increased and the support plate expands, the support plate can expand in a horizontal direction, thereby suppressing vertical deformation of the support plate.

8 Claims, 11 Drawing Sheets

PROBE CARD HAVING A STRUCTURE FOR BEING PREVENTED FROM DEFORMING

TECHNICAL FIELD

The present invention relates to a probe card for inspecting electrical characteristics of an object to be inspected.

BACKGROUND ART

Inspection of electrical characteristics of an electronic circuit, such as an IC or an LSI, formed on, for example, a semiconductor wafer (hereinafter, referred to as a wafer) are performed by using a probe card mounted on a probe device.

For example, as shown in FIG. 10, a probe card 100 includes a support plate 102 that is called a contactor or a guide plate for supporting a plurality of needle-shaped probes 101, and a printed wiring board 103 electrically connected to the support plate 102. The support plate 102 has a bottom surface, on which front end contact portions of the probes 101 protrude, facing a wafer W, and the printed wiring board 103 is disposed at a top surface side of the support plate 102.

A correcting member 104 for correcting the degree of flatness of the support plate 102 is formed at a top surface side of the printed wiring board 103. Fixing mechanisms 105 for integrally connecting the support plate 102, the printed wiring board 103, and the correcting member 104 are fixed to a lower surface of an outer peripheral portion of the correcting member 104. Leaf springs 106 for holding a lower surface of an outer peripheral portion of the support plate 102 and pressing the support plate 102 to the printed wiring board 103 are fixed to lower end surfaces of the fixing mechanisms 105.

Inspection of electrical characteristics of a device on the wafer W is performed by bringing the front end contact portions of the plurality of probes 101 into contact with electrodes of an electronic circuit of the device and applying an electrical inspection signal to a corresponding electrode from each of the plurality of probes 101 through the printed wiring board 103, as disclosed in Patent Document 1 (Japanese Laid-Open Patent Publication No. 2006-10629).

DISCLOSURE OF THE INVENTION

Technical Problem

Since the inspection of the electrical characteristics is performed at a temperature in a wide range of, for example, −20° C. to 150° C., the support plate 102 may expand in a horizontal direction due to, for example, thermal effect, at the time of inspection. However, since the outer peripheral portion of the support plate 102 is fixed by the leaf springs 106, the support plate 102 cannot expand in the horizontal direction, and thus as shown in FIGS. 11A and 11B, a central portion of the support plate 102 may greatly deform in a vertical direction. For example, if the central portion of the support plate 102 deforms vertically upward, as shown in FIG. 11A, the height of each of the probes 101 is greater than a predetermined height, thereby degrading contact stability between each of the probes 101 and the wafer W at the time of inspection. Moreover, if the central portion of the support plate 102 deforms vertically downward, as shown in FIG. 11B, the height of each of the probes 101 is less than the predetermined height, thereby causing damage to the probes 101 or the wafer W. Accordingly, contact between each of the electrodes on the wafer W and each of the probes 101 becomes unstable at the time of inspection, thereby making it difficult to appropriately inspect the electrical characteristics of the wafer W. Also, the deformation is exaggerated in FIGS. 11A and 11B in order to easily explain how the above-described phenomenon occurs.

The present invention is proposed by considering this technical problem. According to the present invention, inspection of electrical characteristics may be appropriately performed by stabilizing contact between probes and an object to be inspected such as a wafer.

Technical Solution

To solve the problems, the present invention provides a probe card which inspects electrical characteristics of an object to be inspected, the probe card including: a circuit board; a support plate which is disposed at a lower surface side of the circuit board and which supports a contactor that contacts the object to be inspected; a holding member which holds a lower surface of an outer peripheral portion of the support plate; and an abutting member disposed between the lower surface of the outer peripheral portion of the support plate and the holding member and protruding upward to abut to the lower surface of the outer peripheral portion of the support plate.

According to the present invention, since the abutting member is disposed between the lower surface of the outer peripheral portion of the support plate and the holding member, horizontal expansion of the support plate itself is allowed. Accordingly, at the time of inspecting electrical characteristics of the object to be inspected, even though the temperature of the support plate is increased, since a corresponding portion can expand in a horizontal direction, vertical deformation of the support plate can be suppressed.

Advantageous Effects

According to the present invention, since horizontal expansion of a support plate can be smoothly performed, vertical deformation of the support plate can be suppressed, thereby stabilizing contact between probes and an object to be inspected and enabling to perform inspection with high precision and high reliability.

BEST MODE FOR CARRYING OUT THE INVENTION

Figure 1:
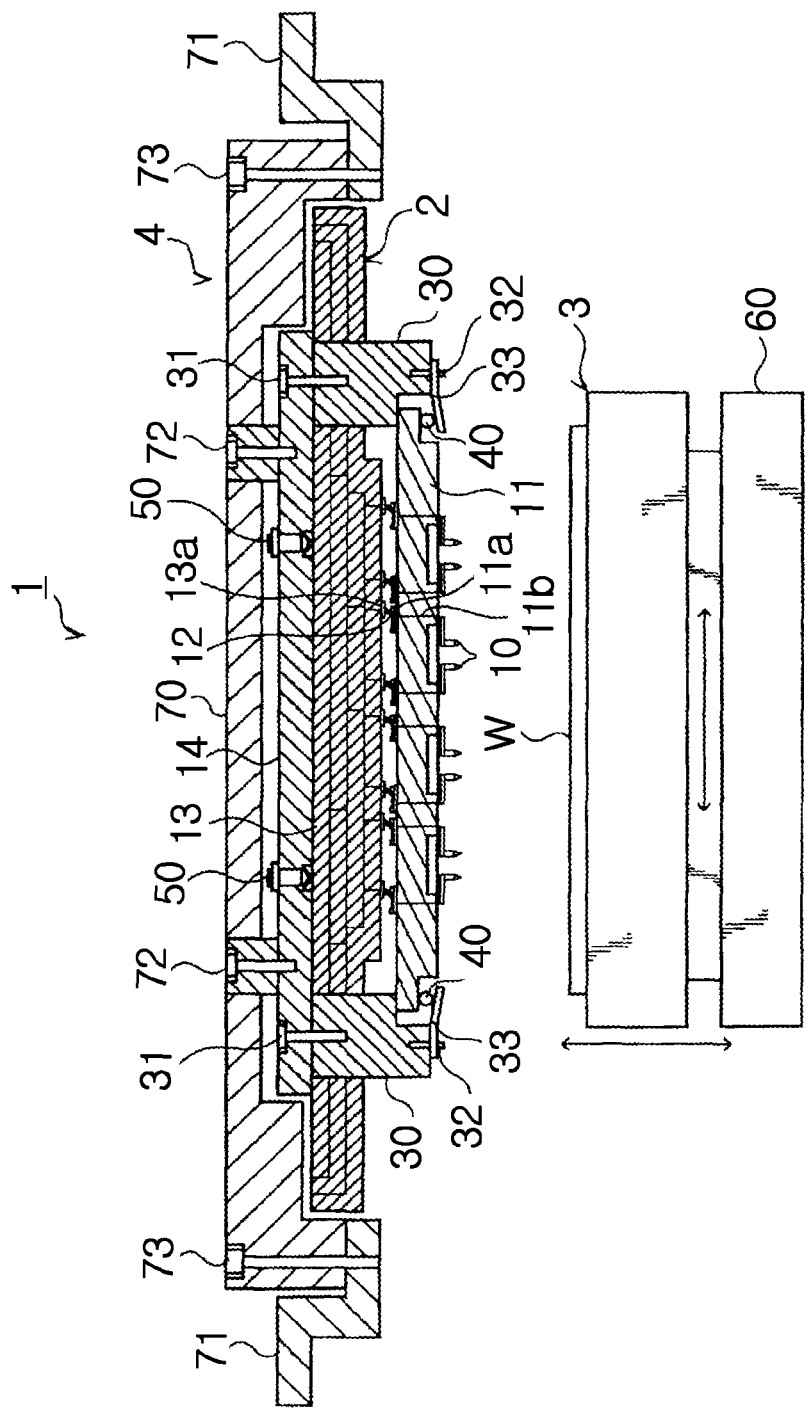
FIG. 1 is a longitudinal-sectional view schematically showing a structure of a probe device on which a probe card is mounted according to an embodiment of the present invention.

Preferred embodiments of the present invention will now be described. FIG. 1 is a longitudinal-sectional view schematically showing a structure of a probe device 1 on which a probe card is mounted according to an embodiment of the present invention.

The probe device 1 includes, for example, a probe card 2, a holding stage 3 on which a wafer W is placed as an object to be inspected, and a holder 4 for holding the probe card 2.

The probe card 2 is formed to have, for example, a nearly disk shape. The probe card 2 includes a support plate 11 for supporting a plurality of probes 10 acting as contactors, a printed wiring board 13 electrically connected as a circuit board to the support plate 11 by contact pins 12, and a correcting member 14 for correcting the degree of flatness of the support plate 11.

The support plate 11 is formed to have, for example, a nearly quadrangular plate shape, and is disposed under a bottom surface of the probe card 2 to face the holding stage 3. The plurality of probes 10 arranged to correspond to a plurality of electrodes (not shown) of the wafer W are attached to and supported by a bottom surface of the support plate 11. Connection terminals 11a to which the contact pins 12 are attached are formed on a top surface of the support plate 11. The connection terminals 11a are connected to connection wires 11b that are formed in the support plate 11 and electrically conduct each of the probes 10 and the contact pins 12 disposed on the top surface of the support plate 11. Also, the support plate 11 is formed of an insulating material having a coefficient of thermal expansion that is almost the same as that of the wafer W, for example, ceramic or glass.

The printed wiring board 13 is formed to have, for example, a nearly disk shape, and is disposed above the support plate 11 in parallel to the support plate 11. Connection terminals 13a contacting the contact pins 12 are formed on a bottom surface of the printed wiring board 13. The connection terminals 13a are connected to an electronic circuit that is formed in the inside of the printed wiring board 13 and transmits an electrical signal between a test head (not shown) and the support plate 11.

A gap having a predetermined width is formed between the printed wiring board 13 and the support plate 11, and the plurality of contact pins 12 for electrically connecting the support plate 11 and the printed wiring board 13 are formed in the gap. The contact pins 12 are arranged within the surface of the support plate 11 at almost regular intervals. The contact pins 12 are formed of a material having elasticity, flexibility, and conductivity, for example, nickel. Upper portions of the contact pins 12 than portions of the printed wiring board 13 connected with the connection terminals 11a of the support plate 11 are bent toward the printed wiring board 13, so that upper end portions of the contact pins 12 are pressed to and brought into contact with the connection terminals 13a of the printed wiring board 13. The upper end portions of the contact pins 12 may freely move vertically and horizontally while being kept in contact with the printed wiring board 13.

Figure 2:
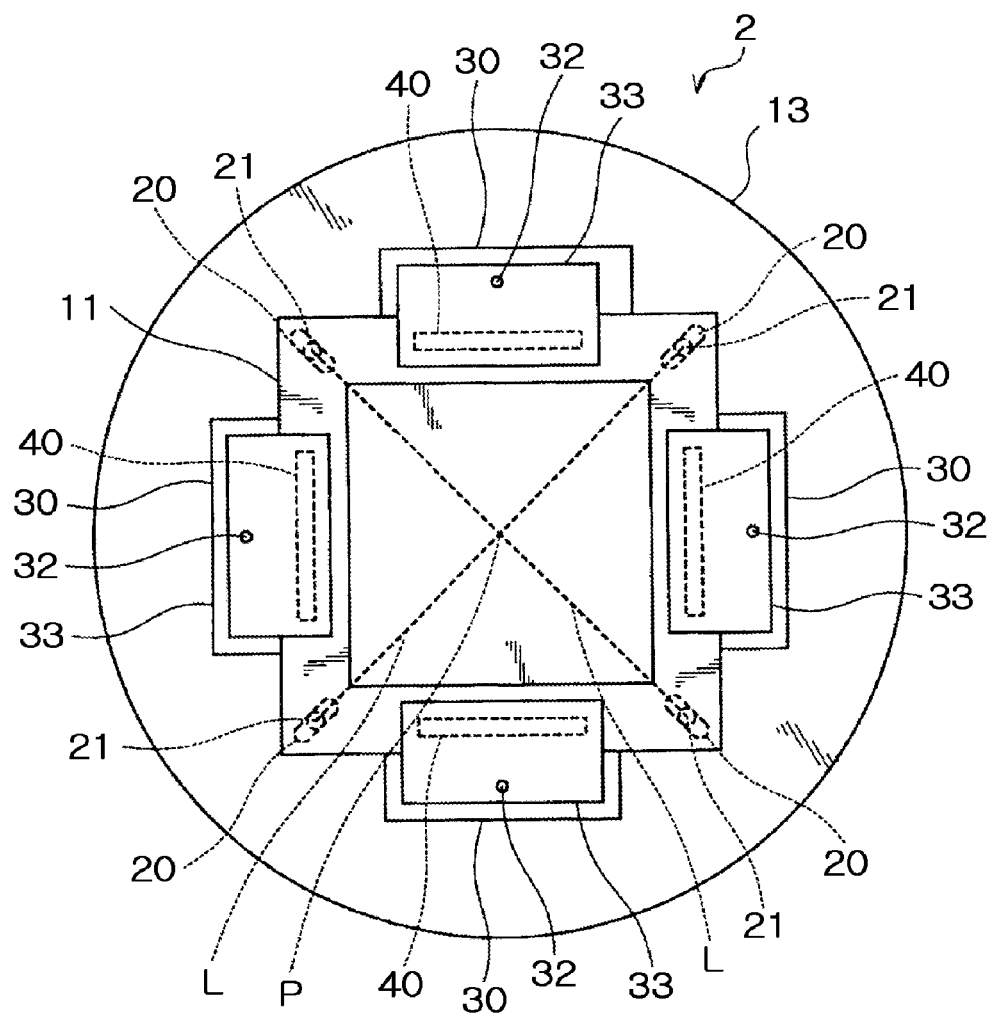
FIG. 2 is a bottom plan view of the probe card.
Figure 3:
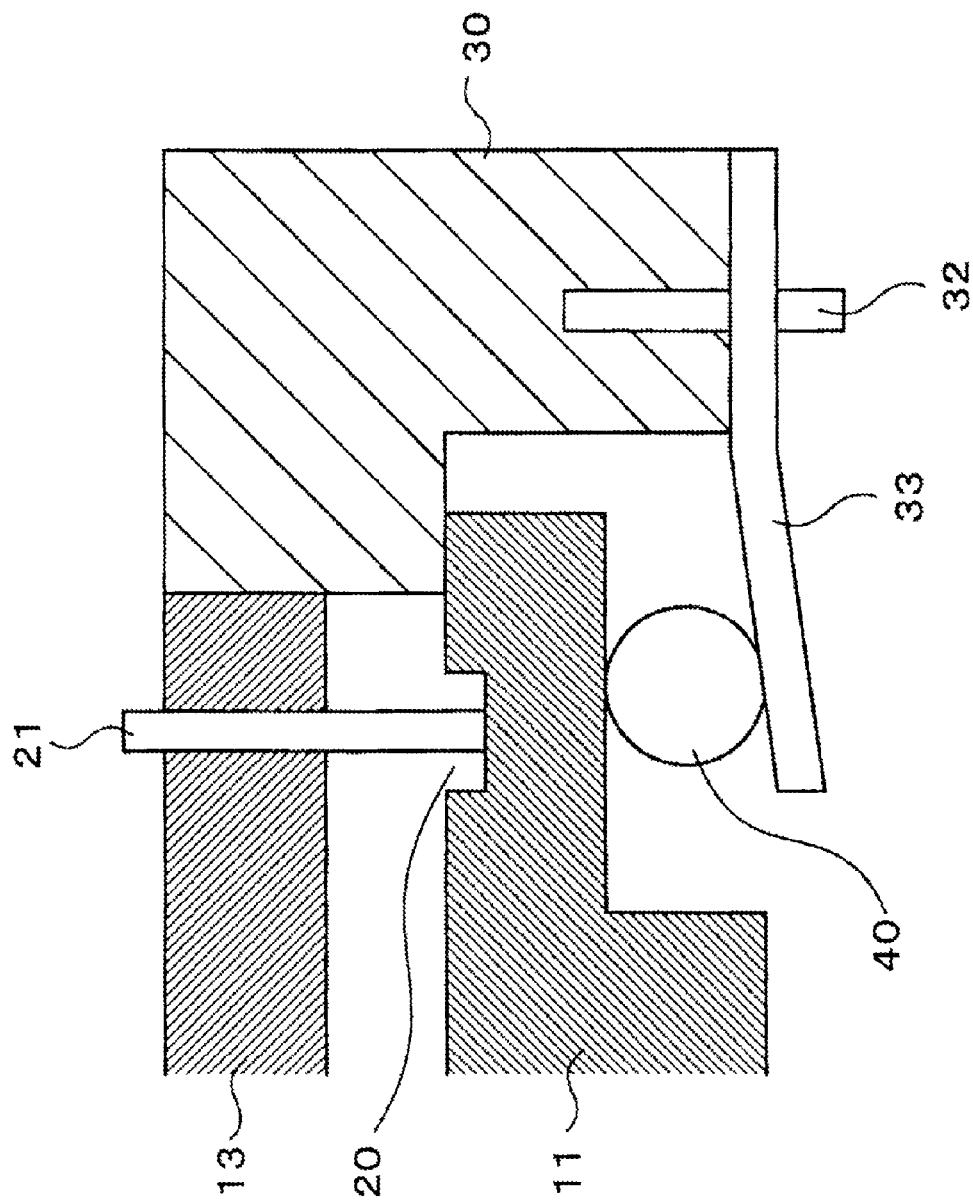
FIG. 3 is a longitudinal-sectional view schematically showing structures of elements around an outer peripheral portion of a support plate of the probe card.

As shown in FIG. 2, guide grooves 20 for guiding horizontal extension and contraction of the support plate 11 are formed as guide portions in a plurality of places, for example, 4 places, of the top surface of the support plate 11. The guide grooves 20 are formed at 90-degree intervals along the same circumference about a center P of the support plate 11. Each of the guide grooves 20 has a length in its longitudinal direction which is greater than a diameter of each of the guide pins 20, and has a length in its transverse direction which is matched with the diameter of each of a plurality of guide pins 21, when viewed from a plane. A central line L in the longitudinal direction of each of the guide grooves 20 passes through the center P of the support plate 11. The guide pins 21, which pass through the printed wiring board 13 in a thickness direction, are inserted into the guide grooves 20 as shown in FIG. 3. Since the guide pins 21 pass through the printed wiring board 13 in the thickness direction, the guide pins 21 are fixed so as not to move in a horizontal direction.

The correcting member 14 has, for example, a nearly disk shape, and as shown in FIG. 1, is disposed at a top surface side of the printed wiring board 13 in parallel to the printed wiring board 13.

Connectors 30 for integrally connecting the support plate 11, the printed wiring board 13, and the correcting member 14 are fixed to a lower surface of an outer peripheral portion of the correcting member 14. The connectors 30 are fixed by, for example, bolts 31 that pass through the correcting member 14 in the thickness direction from a top surface side of the correcting member 14.

Each of the connectors 30 is formed to have a nearly rectangular prism shape that is long in a vertical direction. The connectors 30, as shown in FIG. 2, are formed at a plurality of places, for example, 4 places, of an outer peripheral portion of the support plate 11. The connectors 30 are arranged at regular intervals along the same circumference about the center P of the support plate 11 when viewed from the plane.

The connectors 30 pass through, for example, the printed wiring board 13 in the thickness direction, so that lower end portions of the connectors 30 extend outside of the outer peripheral portion of the support plate 11, as shown in FIG. 1. Leaf springs 33 acting as holding members are fixed to lower end surfaces of the connectors 30 by bolts 32. Due to the leaf springs 33, the outer peripheral portion of the support plate 11 is held upward and pushed toward the printed wiring board 13, thereby maintaining electrical contact between the support plate 11 and the printed wiring board 13. The leaf springs 33 are formed of, for example, stainless steel.

Rollers 40 acting as abutting members are formed between the leaf springs 33 and the lower surface of the outer peripheral portion of the support plate 11 as shown in FIGS. 1 and 3. The rollers 40, as shown in FIG. 2, extend in a direction perpendicular to a diameter direction of the support plate 11. Centers in longitudinal directions of the rollers 40 are arranged at regular intervals along the same circumference about the center P of the support plate 11 when viewed from the plane. Due to the rollers 40, horizontal expansion of the support plate 11 itself is allowed and thus the support plate 11 is held by the leaf springs 33. Also, when the temperature of the support plate 11 is increased at the time of inspecting the wafer W, since the rollers 40 rotate, the support plate 11 smoothly expands in the horizontal direction. Also, the rollers 40 are formed of, for example, stainless steel.

Parallelism adjusting screws 50, for example, passing through the correcting member 14 in the thickness direction from a top surface side of the correcting member 14 and contacting the top surface of the printed wiring board 13, are formed in the correcting member 14. The parallelism adjusting screws 50 are formed at a plurality of places within the surface of the correcting member 14. The degree of flatness of the support plate 11 may be adjusted by rotating each of the parallelism adjusting screws 50 and adjusting a distance between each of the parallelism adjusting screws 50 and the top surface of the printed wiring board 13.

The holding stage 3 is constructed to be freely moved horizontally and vertically by, for example, a driving device 60, and may bring a desired portion of the wafer W into contact with each of the probes 10 by moving the wafer W placed thereon in a three-dimensional (3D) manner.

The holder 4 includes a reinforcing member 70 for reinforcing the printed wiring board 13 by covering a top surface of, for example, the probe card 2, and card holder 71 mounted on a main body (not shown) of the probe device 1 and designed to support an outer peripheral portion of the reinforcing member 70.

The reinforcing member 70 is formed to have, for example, a nearly disk shape. For example, a recess is formed in a bottom surface of the reinforcing member 70, and an upper portion side of the probe card 2 is received in the recess. The reinforcing member 70 is connected to the correcting member 14 by a plurality of bolts 72.

The reinforcing member 70 is fixed to the card holder 71 by bolts 73 that pass through the reinforcing member 70 in the thickness direction from a top surface of the outer peripheral portion of the reinforcing member 70. The card holder 71 is fixed to the main body of the probe device 1.

When electrical characteristics of the wafer W are inspected by using the probe device 1 constructed as described above, the wafer W is first placed on the holding stage 3. Next, for example, the holding stage 3 moves so that the wafer W comes close to the support plate 11 and each of the electrodes of the wafer W contacts each of the probes 10. And, an electrical inspection signal is transmitted to the wafer W through the printed wiring board 13, the support plate 11, and the probes 10, to inspect electrical characteristics of an electronic circuit of the wafer W.

In the above embodiments, since the rollers 40 are disposed between the lower surface of the outer peripheral portion of the support plate 11 and the leaf springs 33, horizontal expansion of the support plate 11 itself is allowed. Accordingly, at the time of inspecting the electrical characteristics of the wafer W, even though the temperature of the support plate 11 is increased, the support plate 11 can expand in the horizontal direction. Also, at this time, the rollers 40 rotate, and thus the support plate 11 can smoothly expand in the horizontal direction. Accordingly, since a corresponding portion of the support plate 11 can expand in the horizontal direction, vertical deformation of the support plate 11 can be suppressed. As a result, since the height of each of the plurality of probes 10 supported by the support plate 11 can be constantly maintained at a predetermined height, and thus contact between the electrodes of the wafer W and the probes 10 at the time of inspection can be stabilized, the electrical characteristics of the wafer W can be appropriately inspected.

Since the length in the longitudinal direction of each of the guide grooves 20 is greater than the diameter of each of the guide pins 21, and thus the guide pins 21 fixed so as not to move in the horizontal direction by the printed wiring board 13 are inserted into the guide grooves 21, when the temperature of the support plate 11 is increased, the support plate 11 is guided by the guide grooves 20 and expands. Also, since the guide grooves 20 are formed at 90-degree intervals along the same circumference about the center P of the support plate 11, and the central line L in the longitudinal direction of each of the guide grooves 20 passes through the center P of the support plate 11, the support plate 11 can expand in the horizontal direction while being maintained in its central position. Accordingly, since the support plate 11 has a coefficient of thermal expansion that is substantially almost the same as that of the wafer W, and thus the support plate 11 expands in the horizontal direction almost in the same manner as the wafer W, the probes 10 can appropriately contact the electrodes of the wafer W without changing horizontal positions of the electrodes of the wafer W with respect to the probes 10 supported by the support plate 11.

Figure 4:
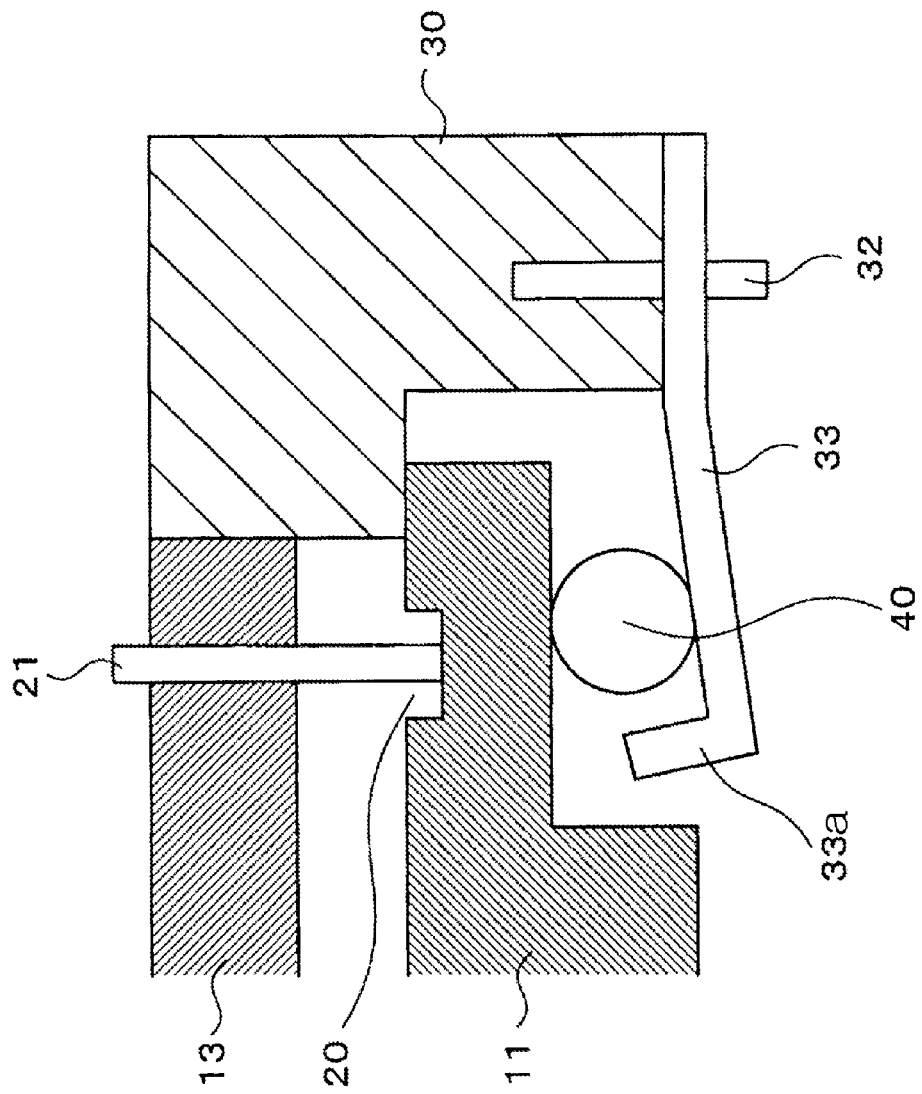
FIG. 4 is a longitudinal-sectional view schematically showing structures of elements around the outer peripheral portion of the support plate of the probe card.

Stoppers 33a for preventing separation of the rollers 40 may be formed on front ends of the leaf springs 33 in the above embodiments, as shown in FIG. 4. The stoppers 33a may be formed by being bent upward from main bodies of the leaf springs 33. Accordingly, even though, for example, the rollers 40 are displaced in the horizontal direction from the leaf springs 33 due to an external disturbance, such as a vibration, of the probe card 2, the rollers 44 can be prevented from dropping.

Figure 5:
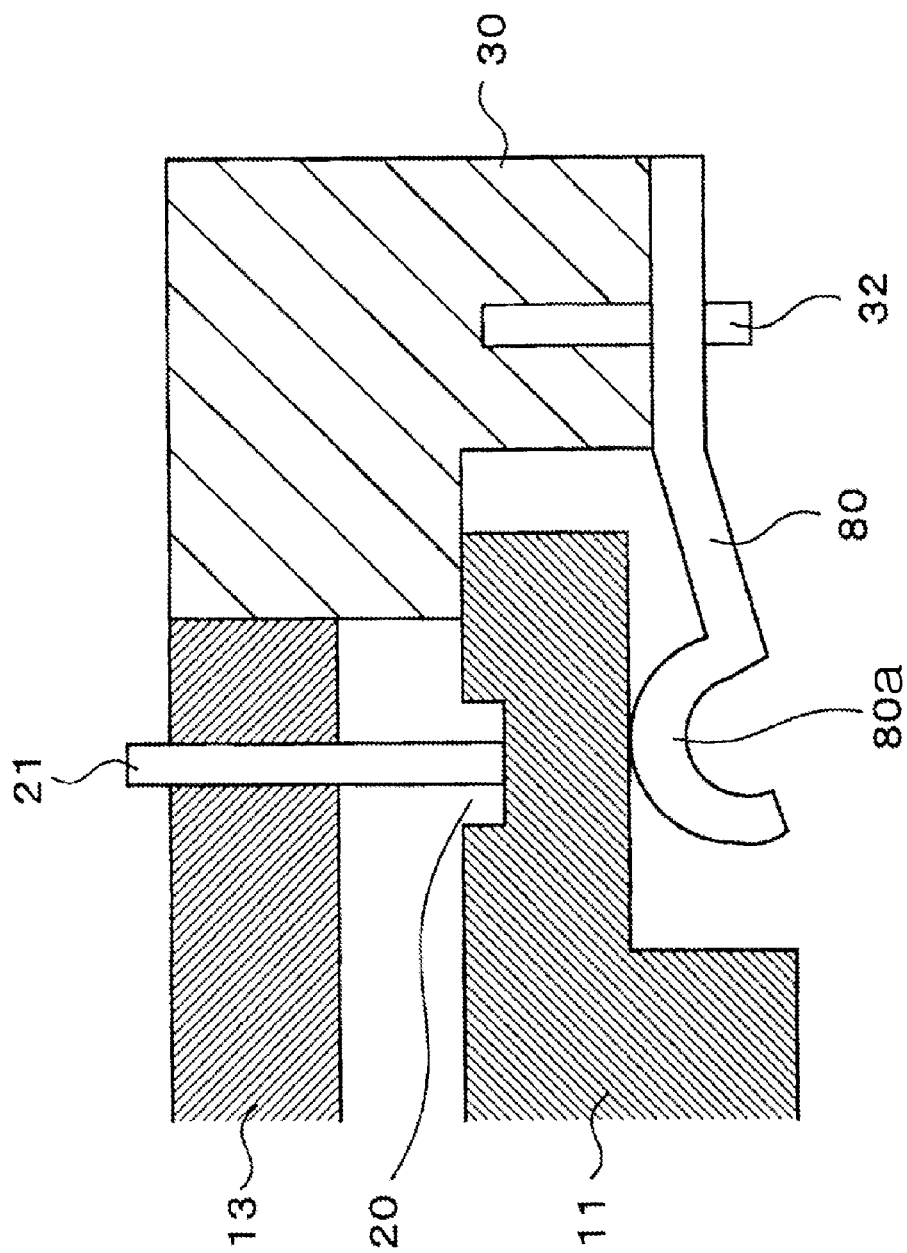
FIG. 5 is a longitudinal-sectional view schematically showing structures of elements around the outer peripheral portion of the support plate of the probe card.

Although the rollers 40 are formed between the lower surface of the outer peripheral portion of the support plate 11 and the leaf springs 33 in the above embodiments, leaf springs 80 having convex front ends, instead of the leaf springs 33 and the rollers 40, may be formed as shown in FIG. 5. The front ends 80a of the leaf springs 80 protrude in a nearly semicircular shape when viewed from a side surface, and contact the lower surface of the outer peripheral portion of the support plate 11. Accordingly, since horizontal expansion of the support plate 11 itself is allowed, even though the temperature of the support plate 11 is increased, the support plate 11 can expand in the horizontal direction, thereby suppressing vertical deformation of the support plate 11.

Figure 6:
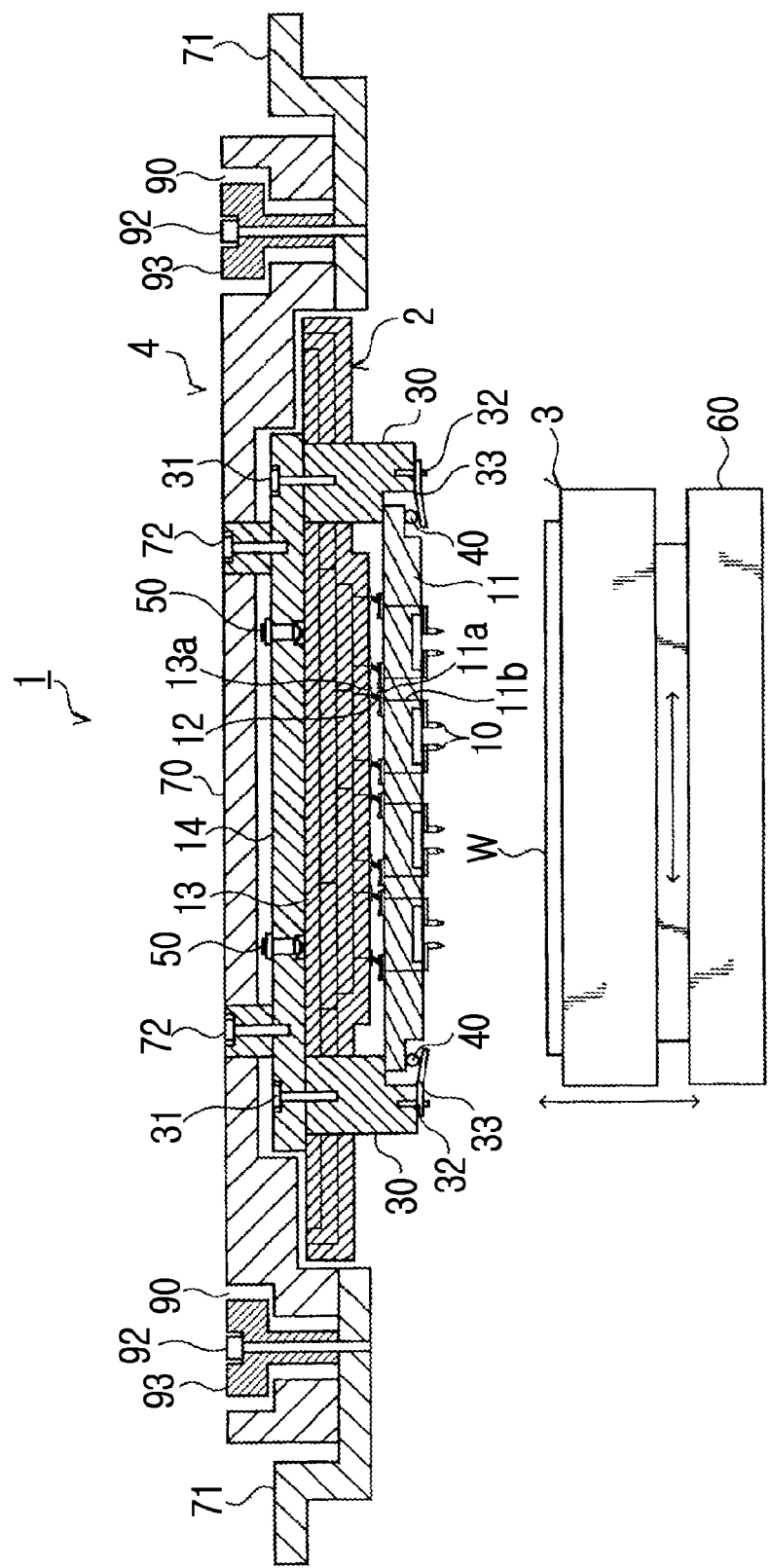
FIG. 6 is a longitudinal-sectional view schematically showing a structure of a probe device including a probe card according to another embodiment of the present invention.

Although the outer peripheral portion of the reinforcing member 70 is fixed to the card holder 71 by the bolts 73 in the above embodiments, a plurality of long guide holes 90 passing through the outer peripheral portion of the reinforcing member 70 in the thickness direction may be formed so that the outer peripheral portion of the reinforcing member 70 extends and contracts in the horizontal direction as shown in FIG. 6.

Figure 7:
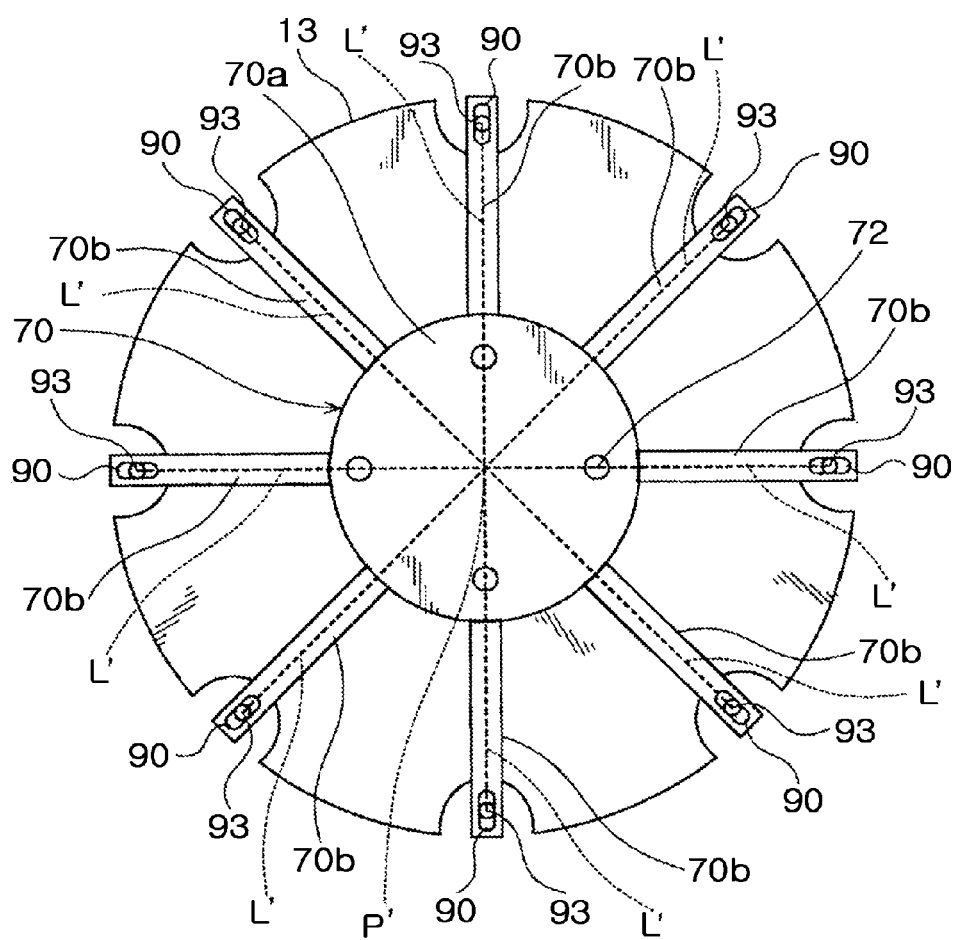
FIG. 7 is a top plan view of the probe card.

The guide holes 90 are respectively formed in 8 connection members 70b each having a nearly rectangular parallelepiped shape which is connected to a main body 70a having a nearly disk shape of the reinforcing member 70, and extend in a diameter direction outwardly from an outer circumference of the main body 70a as shown in FIG. 7. Also, the guide holes 90 are formed to extend along the connection members 70b when viewed from the plane, that is, central lines L' in the longitudinal direction passes through a center P' of the reinforcing member 70, so that a plurality of the central lines L' intersect at the center P'. Also, the guide holes 90 are formed at 45-degree intervals along the same circumference about the center P' of the reinforcing member 70. Also, the number of the connection members 70b is determined by a shape of a test head (not shown) connected to the printed wiring board 13 of the probe card 2. For example, 4 connection members 70b may be formed. In this case, the guide holes 90 are formed at 45-degree intervals along the same circumference about the center P' of the reinforcing member 70.

Figure 8:
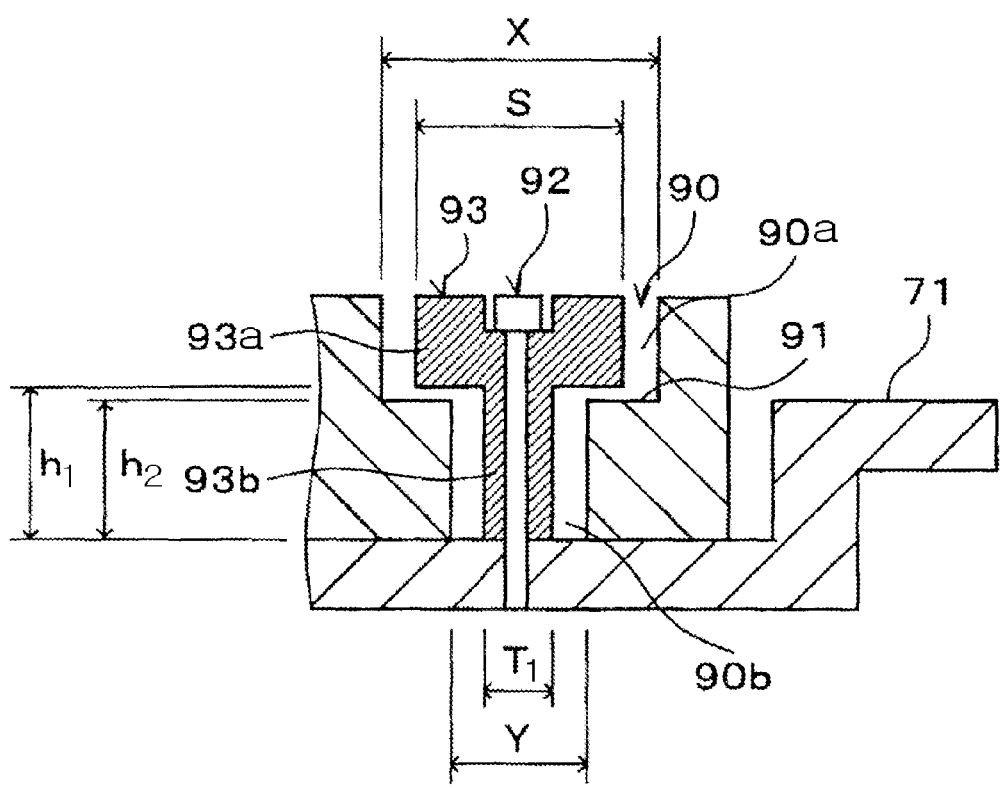
FIG. 8 is a longitudinal-sectional view schematically showing structures of elements around an outer peripheral portion of a top plate of the probe card.
Figure 9:
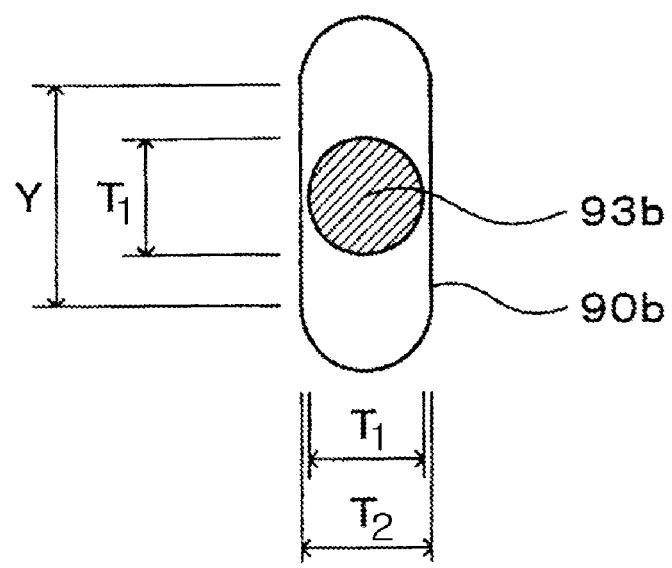
FIG. 9 is a plan view schematically showing structures of guide holes and support portions of collars.
Figure 10:
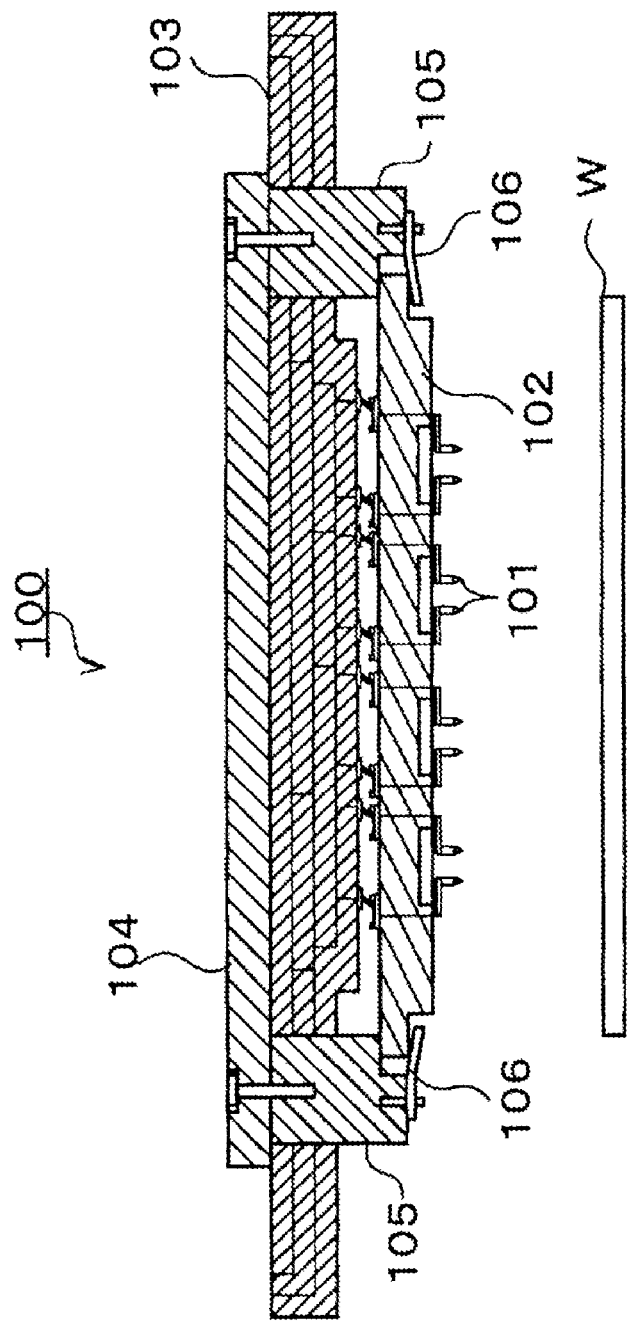
FIG. 10 is a longitudinal-sectional view schematically showing a structure of a conventional probe card.
Figure 11A:
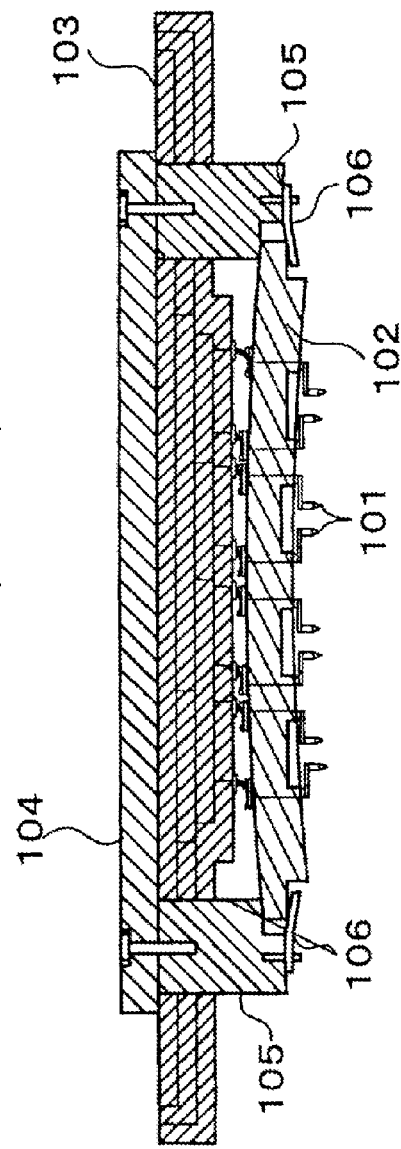
FIGS. 11A and 11B are longitudinal-sectional views showing a state where a support plate of the conventional probe card deforms, FIG. 11A showing a state where a central portion of the support plate deforms vertically upward, FIG. 11B showing a state where the central portion of the support plate deforms vertically downward.
Figure 11B:
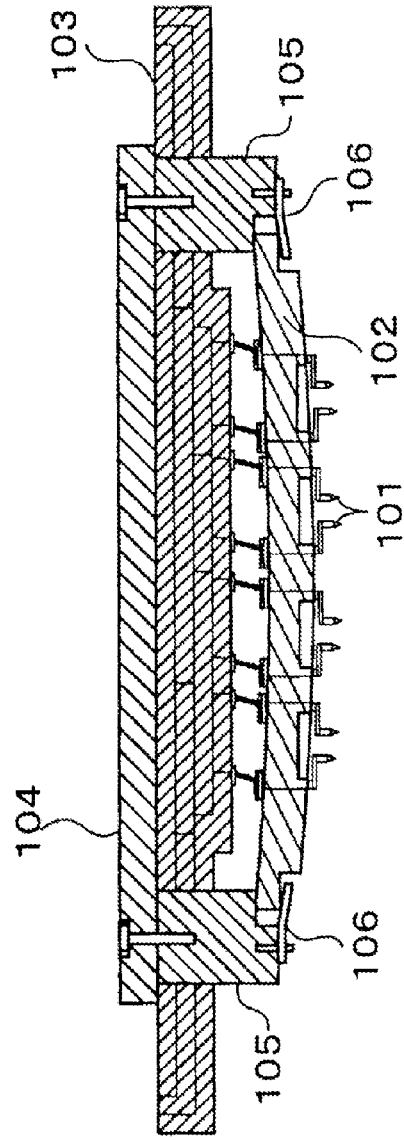

In the guide holes 90, as shown in FIG. 8, stepped portions 91 having lower portions protruding along inner circumferences of the guide holes 90 are respectively formed. Bolts 92 fixed to the card holder 71 are formed in the guide holes 90. Collars 93 are respectively formed around outer circumferences of the bolts 92, and are fixed to the card holder 71 by the bolts 92. Each of the collars 93 includes a flange portion 93a formed in an upper portion thereof and a support portion 93b formed in the lower portion.

The flange portions 93a of the collars 93 are respectively formed above the stepped portions 91 to be spaced apart slightly from the stepped portions 91, for example, in such a manner that a distance $h_1$ between lower surfaces of the flange portions 93a and upper surface of the card holder 71 is several μm greater than a distance $h_2$ between the stepped portions 91 and the upper surface of the card holder 71. Accordingly, although the bolts 92 are fastened, the outer peripheral portion of the reinforcing member 70 is not fixed correspondingly in the vertical direction. Also, a length X in a longitudinal direction of each of upper portions 90a than the stepped portions 91 of the guide holes 90 when viewed from a plane is greater than a diameter S of each of the flange portions 93a, and a length Y in a longitudinal direction of each of lower portions 90b than the stepped portions 91 of the guide holes 90 when viewed from a plane is greater than a diameter $T_1$ of each of the support portions 93b. Accordingly, horizontal expansion of the reinforcing member 70 itself is allowed. Also, since the diameter S of each of the flange portions 93a is greater than the length Y in the longitudinal direction of each of the lower portions 90b of the guide holes 90, getting loose of the reinforcing member 70 is suppressed. Also, the diameter $T_1$ of each of the support portions 93b of the collars 93 may be slightly, for example, several μm, less than a length $T_2$ in a transverse direction of each of the lower portions 90b of the guide holes 90 when viewed from a plane.

Here, for example, at the time of inspecting the electrical characteristics of the wafer W, when the temperature of the reinforcing member 70 is increased, if the outer peripheral portion of the reinforcing member 70 is fixed in the horizontal direction, a central portion of the reinforcing member 70 may deform vertically upward. In this case, due to the vertical deformation of the reinforcing member 70, heights of the plurality of probes 10 supported by the support plate 11 from the wafer W become irregular, thereby making contact between the probes 10 and the electrodes of the wafer W unstable. However, in the above embodiments, since the guide holes 90 respectively pass through the plurality of connection members 70b of the reinforcing member 70 in the thickness direction of the connection members 70b, the length X in the longitudinal direction of each of the upper portions 90a of the guide holes 90 is greater than the diameter S of each of the flange portions 93a of the collars 93, and the length Y in the longitudinal direction of each of the lower portions 90b is greater than the diameter $T_1$ of each of the support portions 93b, horizontal expansion of the reinforcing member 70 itself is allowed. Also, since the flange portions 93a of the collars 93 are formed above the stepped portions 91 to be spaced apart slightly, for example, several μm, from the stepped portions 91, although the bolts 92 are fastened, the outer peripheral portion of the reinforcing member 70 is not fixed correspondingly in the vertical direction. Accordingly, at the time of inspecting the electrical characteristics of the wafer W, even though the temperature of the reinforcing member 70 is increased, the reinforcing member 70 can expand in the horizontal direction, thereby suppressing vertical deformation of the reinforcing member 70. Accordingly, since vertical deformation of the support plate 11 formed under the reinforcing member 70 is also suppressed, the heights of the plurality of probes 10 supported by the support plate 11 can be constantly maintained at predetermined heights. Accordingly, contact between the probes 10 and the electrodes of the wafer W can be stabilized.

Also, since the diameter S of each of the flange portions 93a of the collars 93 is greater than the length Y in the longitudinal direction of each of the lower portions 90b of the guide holes 90, when the temperature of the reinforcing member 70 is increased and the reinforcing member 70 expands, getting loose of the reinforcing member 70 can be suppressed.

Also, since the guide holes 90 are formed to extend along the connection members 70b, the central lines L' in the longitudinal direction intersect at the center P' of the reinforcing member 70, and the diameter $T_1$ of each of the support portions 93b of the collars 93 is slightly, for example, several μm, less than the length $T_2$ in the transverse direction of each of the lower portions 90b of the guide holes 90, when the temperature of the reinforcement member 70 is increased and the reinforcing member 70 expands, the reinforcing member 70 can smoothly expand outwardly from the center P' without being displaced from its central position. That is, the reinforcing member 70 can expand without being displaced in a rotational direction.

While the present invention has been particularly described with reference to appropriate embodiments thereof by referring to the attached drawings, it will be understood by those of ordinary skill in the art that various changes in form and details may be made therein without departing from the spirit and scope of the present invention as defined by the following claims. The present invention is not limited to the embodiments and may adopt various other types. The present invention may also be used even when a substrate is not a wafer but a substrate such as a mask reticle for photomask or an FPD (flat panel display).

INDUSTRIAL APPLICABILITY

The present invention is useful for a probe card for inspecting electrical characteristics of an object to be inspected such as a semiconductor wafer.

The invention claimed is:
1. A probe card which inspects electrical characteristics of an object to be inspected, the probe card comprising:
 a circuit board;
 a support plate which is disposed at a lower surface side of the circuit board and which supports a contactor that contacts the object to be inspected;
 a holding member which holds a lower surface of an outer peripheral portion of the support plate; and
 a roller having a circular cylindrical shape, whose axis extends in a direction perpendicular to a radial direction of the support plate, and interposed between the lower surface of the outer peripheral portion of the support plate and the holding member.
2. The probe card of claim 1, wherein a plurality of the rollers are included,
 wherein the plurality of the rollers are arranged at regular intervals along the same circumference about a center of the support plate when viewed from a plane.
3. The probe card of claim 1, wherein the holding member presses the roller and the support plate to the circuit board.
4. The probe card of claim 3, wherein the holding member is a leaf spring.
5. The probe card of claim 1, wherein a stopper which prevents separation of the roller is formed on a front end of the holding member.
6. The probe card of claim 1, wherein a plurality of guide portions which guide horizontal extension and contraction of the support plate by inserting guide pins therein are formed on a top surface of the support plate, wherein a length in a longitudinal direction of each of the guide portions is greater than a diameter of each of the guide pins when viewed from a plane, wherein a central line in the longitudinal direction of each of the guide portions passes through a center of the support plate.

7. The probe card of claim 6, wherein the guide portions are formed at four places, wherein the guide portions are formed at 90-degree intervals along the same circumference about the center of the support plate.

8. The probe card of claim 6, wherein the guide pins are fixed so as not to be moved in a horizontal direction by the circuit board.

* * * * *

UNITED STATES PATENT AND TRADEMARK OFFICE
CERTIFICATE OF CORRECTION

PATENT NO. : 8,415,964 B2
APPLICATION NO. : 12/745303
DATED : April 9, 2013
INVENTOR(S) : Toshihiro Yonezawa and Shinichiro Takase It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 436 days.

Signed and Sealed this
Eighteenth Day of June, 2013

Teresa Stanek Rea
*Acting Director of the United States Patent and Trademark Office*